United States Patent
Park (10) Patent No.: US 10,210,937 B2
(45) Date of Patent: Feb. 19, 2019

(54) SEMICONDUCTOR STORAGE DEVICE WITH MULTIPLE BLOCKS

(71) Applicant: SK hynix Inc., Icheon (KR)

(72) Inventor: Jin Su Park, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 14/691,263

(22) Filed: Apr. 20, 2015

(65) Prior Publication Data

US 2016/0163390 A1 Jun. 9, 2016

(30) Foreign Application Priority Data

Dec. 8, 2014 (KR) .................. 10-2014-0175272
Dec. 19, 2014 (KR) .................. 10-2014-0184852

(51) Int. Cl.
G11C 16/10 (2006.01)
G11C 16/26 (2006.01)
G11C 16/04 (2006.01)
G11C 16/08 (2006.01)

(52) U.S. Cl.
CPC .......... *G11C 16/10* (2013.01); *G11C 16/0483* (2013.01); *G11C 16/08* (2013.01); *G11C 16/26* (2013.01)

(58) Field of Classification Search
CPC .................................................. G11C 16/10
USPC ...................................................... 365/185.11
See application file for complete search history.

(56) References Cited

U.S. PATENT DOCUMENTS

| 2010/0232224 A1* | 9/2010 | Maeda | G11C 16/0483 365/185.18 |
| 2011/0063916 A1* | 3/2011 | Maeda | G11C 16/04 365/185.17 |
| 2012/0008400 A1* | 1/2012 | Fukuzumi | G11C 16/0483 365/185.18 |
| 2013/0058165 A1* | 3/2013 | Maejima | H01L 27/088 365/185.11 |

FOREIGN PATENT DOCUMENTS

KR 10-0881536 B1 2/2009

* cited by examiner

*Primary Examiner* — Tha-O H Bui
*Assistant Examiner* — Alfredo Bermudez Lozada (57) ABSTRACT

A semiconductor device includes a memory array including a plurality of memory blocks. Each memory block includes a pipe transistor, a drain select transistor and a first memory cell connected between the pipe transistor and a bit line, and a source select transistor and a second memory cell connected between the pipe transistor and a common source line. The semiconductor device further includes an operation circuit configured to apply an operating voltage to a memory block selected to perform program and read operations, and a gate control circuit configured to control a gate of the pipe transistor included in an unselected memory block.

8 Claims, 9 Drawing Sheets

SEMICONDUCTOR STORAGE DEVICE WITH MULTIPLE BLOCKS

CROSS-REFERENCE TO RELATED APPLICATIONS

The present application claims priority to Korean Patent Application Numbers 10-2014-0175272 filed on Dec. 8, 2014 and 10-2014-0184852 filed on Dec. 19, 2014, in the Korean Intellectual Property Office, the entire disclosures of which are incorporated by reference herein.

BACKGROUND

1. Technical Field

Embodiments of the present disclosure relate to a semiconductor device, and more particularly, to a semiconductor device including a memory block.

2. Related Art

Memory blocks of a semiconductor device include memory cells connected between bit lines and a common source line. When performing a data input or output operation, operating voltages are supplied to local lines of a selected memory block, and local lines of an unselected memory block are set to a floating state. When the local lines of the unselected memory block are set to the floating state, leakage current may flow between a bit line and a common source line, causing a failure or degradation in the reliability of the operation.

BRIEF SUMMARY

Embodiments of the present disclosure are directed to a semiconductor device in which operational characteristics and reliability are improved.

In an embodiment, a semiconductor device includes a memory array including a plurality of memory blocks, wherein each memory block includes a pipe transistor, a drain select transistor and a first memory cell connected between the pipe transistor and a bit line, and a source select transistor and a second memory cell connected between the pipe transistor and a common source line. The semiconductor device further includes an operation circuit configured to apply an operating voltage to a selected memory block to perform a program operation and a read operation, and includes a gate control circuit configured to control a gate of the pipe transistor included in an unselected memory block.

In another embodiment, a semiconductor device includes a memory array including a plurality of memory blocks wherein each memory block includes a pipe transistor, a drain select transistor and a first memory cell connected between the pipe transistor and a bit line, and a source select transistor and a second memory cell connected between the pipe transistor and a common source line. The semiconductor device further includes an operation circuit configured to apply an operating voltage to a memory block selected to perform a program operation and a read operation, and includes a gate control circuit configured to control gates of the drain select transistor, the source select transistor, and the pipe transistor included in the unselected memory block.

DETAILED DESCRIPTION

Advantages and features of embodiments and methods of achieving the same will be described more fully hereinafter with reference to the accompanying drawings, in which illustrative embodiments of the present disclosure are shown. Embodiments may, however, have different forms than those shown and should not be construed as limited to the embodiments set forth herein. The embodiments presented herein are provided for describing in detail to enable implementation of the embodiments by those of ordinary skill in the art, and the spirit and scope of the present disclosure should be understood from the claims.

Figure 1:
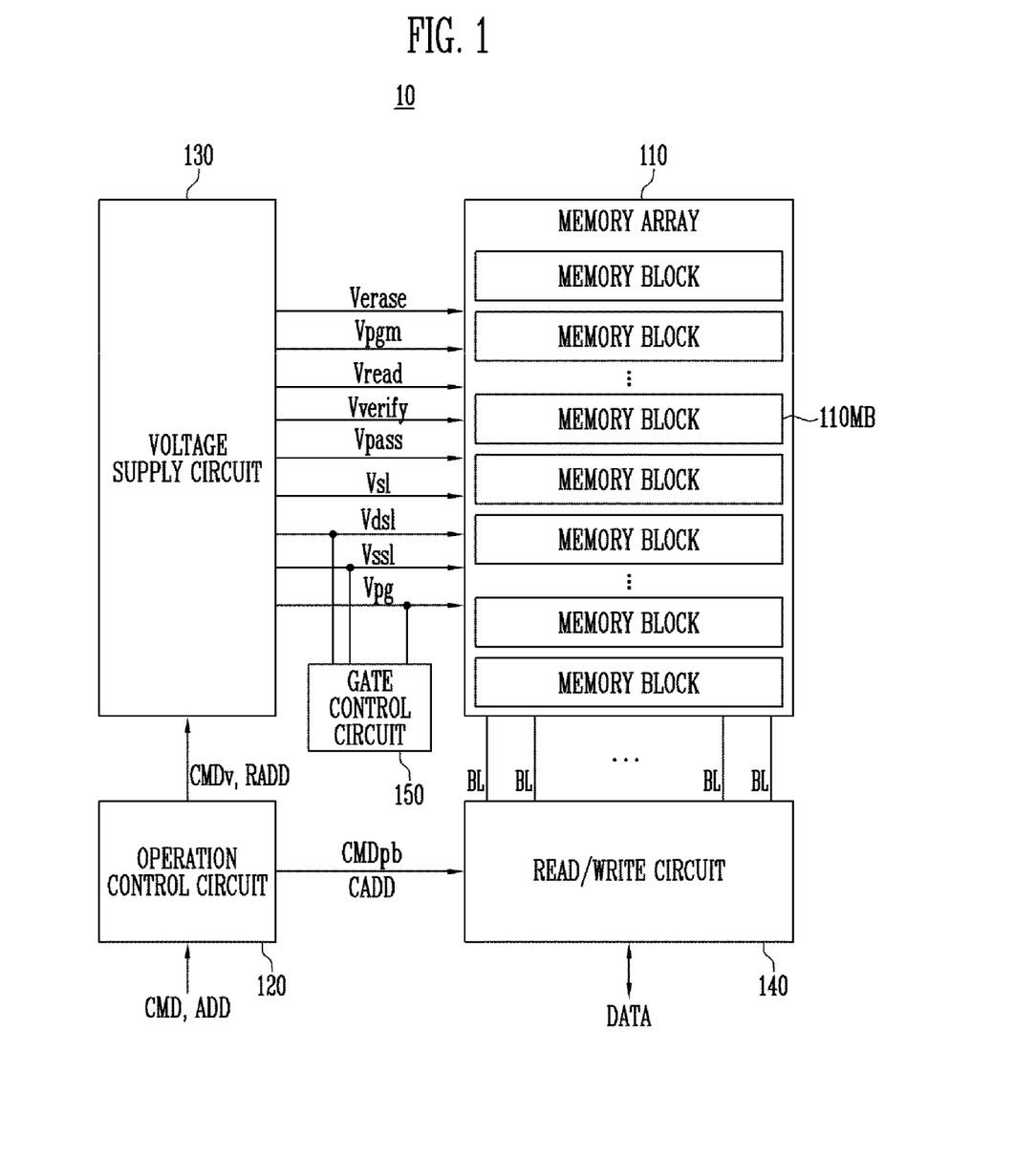
FIG. 1 is a block diagram illustrating a semiconductor device according to an illustrative embodiment.

FIG. 1 is a block diagram illustrating a semiconductor device 10 according to an illustrative embodiment.

Referring to FIG. 1, the semiconductor device 10 includes a memory array 110, first, second, and third operation circuits 120, 130, and 140, and a gate control circuit 150. The memory array 110 includes a plurality of memory blocks 110MB. Each memory block 110MB includes a plurality of memory strings. Each memory string includes a plurality of memory cells. In a flash memory device, the memory block may include a flash memory cell. The memory cell may include a floating gate formed of polysilicon or a charge storage layer formed of a nitride film.

Particularly, the memory block 110MB may include U-shape memory strings connected to respective bit lines and connected in parallel to a common source line. A structure of the memory block will be described in more detail.

Figure 2A:
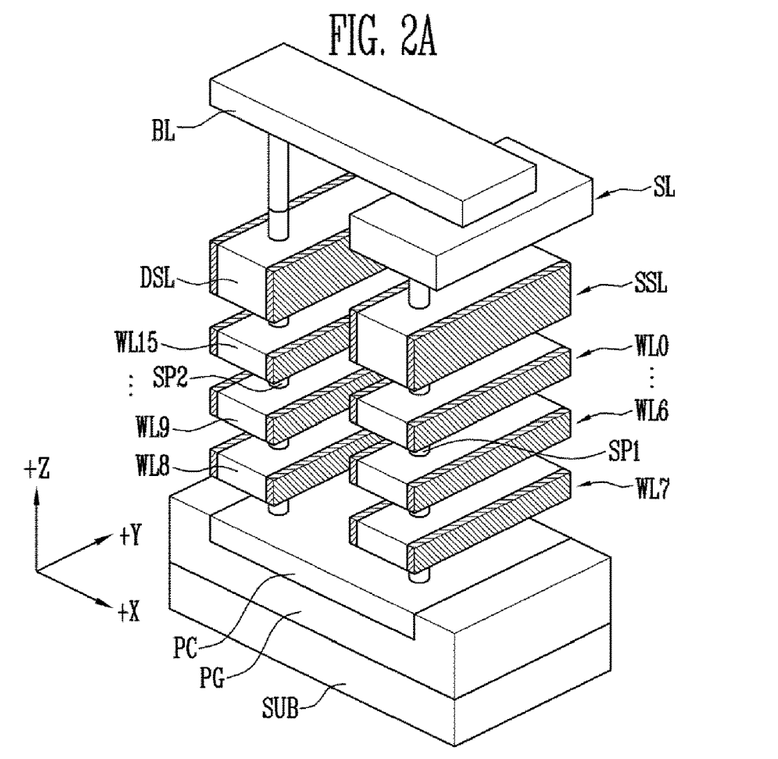
FIGS. 2A to 2C are views illustrating a memory block according to an illustrative embodiment.
Figure 2B:
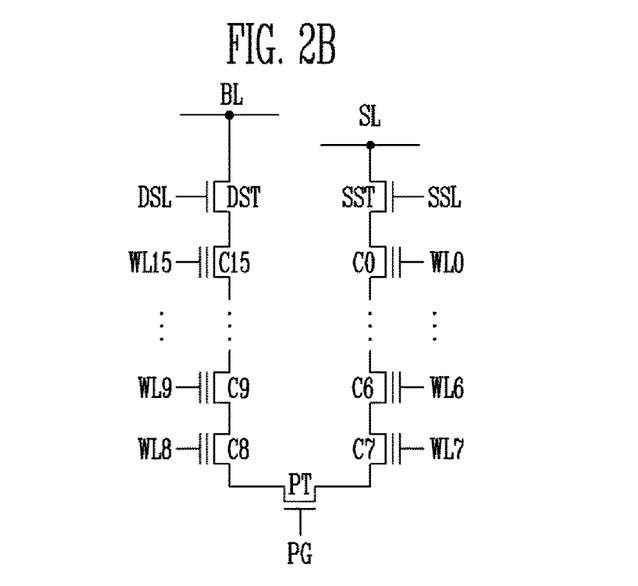
Figure 2C:
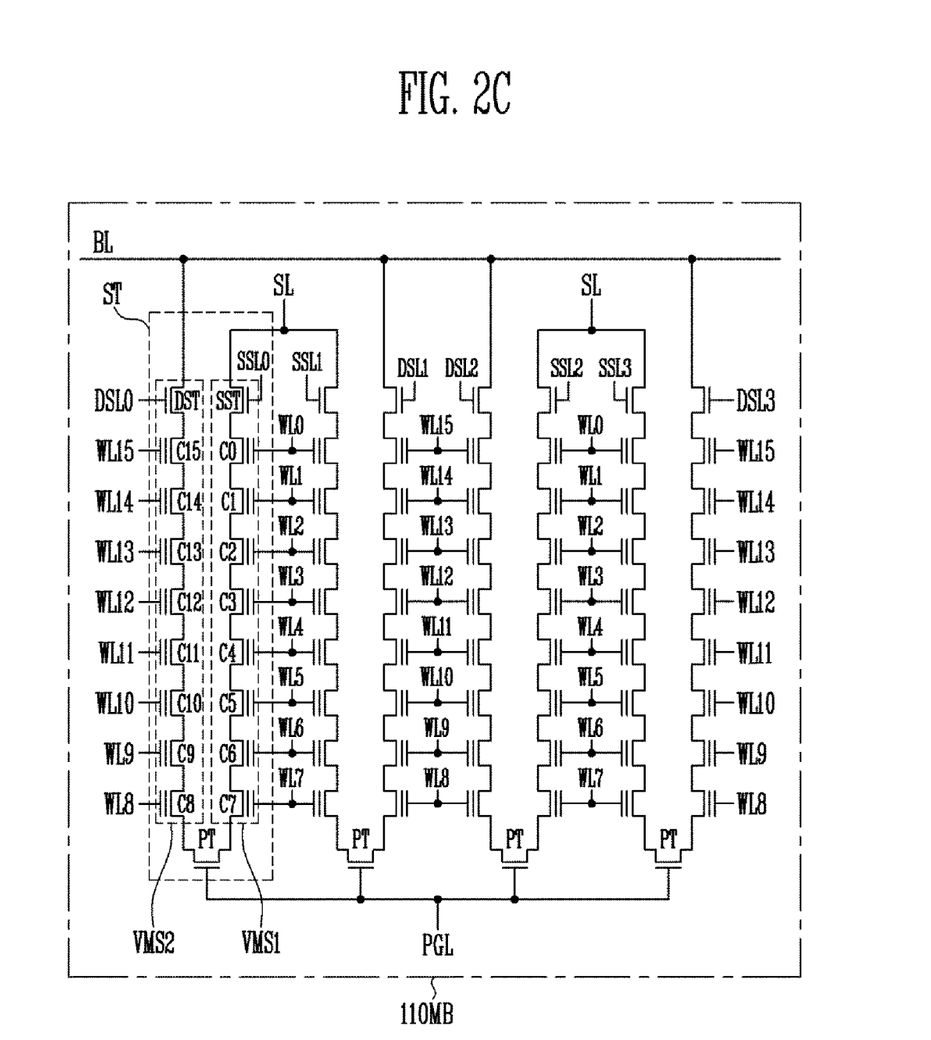

FIGS. 2A to 2C are views illustrating features of the memory block 110MB according to an illustrative embodiment.

Referring to FIGS. 2A and 2B, a pipe gate PG including a recessed area is formed on a semiconductor substrate SUB, and a pipe channel layer PC is formed in the recessed area of the pipe gate PG. A plurality of first and second vertical channel layers SP1 and SP2 are formed on the pipe channel layer PC. In each pair of first and second vertical channel layers SP1 and SP2, an upper part of the first vertical channel layer SP1 is connected to a common source line SL, and an upper part of the second vertical channel layer SP2 is connected to a bit line BL. The first and second vertical channel layers SP1 and SP2 may be formed of polysilicon.

A first plurality of conductive layers, indicated by reference characters DSL and WL15 to WL8, are formed to surround the second vertical channel layer SP2 at different heights thereof. In addition, a second plurality of conductive layers, indicated by reference characters SSL and WL0 to WL7, are formed to surround the first vertical channel layer SP1 at different heights thereof. A multilayer structure (not shown) including a charge storage layer and at least one dielectric layer is disposed over surfaces of the first and second vertical channel layers SP1 and SP2 and the pipe channel layer PC. Portions of the multilayer structure are disposed between the second vertical channel layer SP2 and the first plurality of conductive layers, between the first vertical channel layer SP1 and the second plurality of conductive layers, and between the pipe channel layer PC and the pipe gate PG.

In the first plurality of conductive layers, an uppermost conductive layer surrounding the second vertical channel layer SP2 may serve as a drain select line DSL and conductive layers under the drain select line DSL may serve as sixteenth to ninth word lines WL15 to WL8. In the second plurality of conductive layers, an uppermost conductive layer surrounding the first vertical channel layer SP1 may serve as a source select line SSL and conductive layers under the source select line SSL may serve as first to eighth word lines WL0 to WL7. Some conductive layers used as word lines may serve as dummy word lines (not shown).

In other words, the second plurality of conductive layers and the first plurality of conductive layers are respectively stacked over different areas of the semiconductor substrate SUB. The first vertical channel layer SP1 passing through the second plurality of conductive layers is vertically connected between the source line SL and the pipe channel layer PC. The second vertical channel layer SP2 passing through the first plurality of conductive layers is vertically connected between the bit line BL and the pipe channel layer PC.

A drain select transistor DST is formed where the drain select line DSL surrounds the second vertical channel layer SP2, and sixteenth to ninth main cell transistors C15 to C8 are formed where the sixteenth to ninth word lines WL15 to WL8 surround the second vertical channel layer SP2, respectively. A source select transistor SST is formed where the source select line SSL surrounds the first vertical channel layer SP1 and first to eighth main cell transistors C0 to C7 are formed where the first to eighth word lines WL0 to WL7 surround the first vertical channel layer SP1, respectively.

According to the structure described above, a memory string may include a drain select transistor DST and sixteenth to ninth main cell transistors C15 to C8 disposed perpendicularly to a substrate SUB and connected in series between a bit line BL and a pipe channel layer PC, and may further include a source select transistor SST and first to eighth main cell transistors C0 to C7 disposed perpendicularly to the substrate SUB and connected in series between the source select transistor SST and the pipe channel layer PC. In the above structure, a dummy cell transistor (not shown) may also be connected between the drain or source select transistors DST or SST and the sixteenth or first main cell transistor C15 or C0, respectively, and a dummy cell transistor (not shown) may also be connected between the ninth or eighth main cell transistor C8 or C7 and a pipe transistor PT, respectively.

The source select transistor SST and the first to eighth main cell transistors C0 to C7 connected between the common source line SL and the pipe transistor PT may form a first vertical memory string. The drain select transistor DST and the sixteenth to ninth main cell transistors C15 to C8 connected between the bit line BL and the pipe transistor PT may form a second vertical memory string.

Referring to FIG. 2C, the memory block 110MB includes a plurality of memory strings ST connected to bit lines BL. Each of the memory strings ST has a U-shape structure, and includes a first vertical memory string VMS1 vertically connected between a common source line SL and a pipe transistor PT disposed in the substrate SUB, and a second vertical memory string VMS2 vertically connected between a bit line BL and the pipe transistor PT of the substrate SUB. Each first vertical memory string VMS1 includes a source select transistor SST and first to eighth memory cells C0 to C7. The source select transistors SST of the plurality of memory strings ST are controlled by voltages supplied to first to fourth source select lines SSL0 to SSL3, respectively, and the first to eighth memory cells C0 to C7 are controlled by voltages supplied to stacked first to eighth word lines WL0 to WL7, respectively. Each second vertical memory string VMS2 includes a drain select transistor DST and ninth to sixteenth memory cells C8 to C15. The drain select transistors DST of the plurality of memory strings ST are controlled by voltages supplied to first to fourth drain select lines DSL0 to DSL3, respectively, and the ninth to sixteenth memory cells C8 to C15 are controlled by voltages supplied to stacked ninth to sixteenth word lines WL8 to WL15, respectively.

When the memory block 110MB is selected, the pipe transistor PT connected between the pair of memory cells C7 and C8 in the middle of each of the memory strings ST of the memory block 110MB electrically connects the channel layer of each of the first vertical memory strings VMS1 with the channel layer of the respective second vertical memory strings VMS2.

In a memory block of the related art having a two dimensional structure, each memory string is connected to a respective bit line, and drain select transistors of a memory block are simultaneously controlled by one drain select line. In contrast, in the memory block 110MB having a three dimensional structure, a plurality of memory strings ST is commonly connected to one bit line BL. In the memory block 110MB, the number of memory strings ST commonly connected to one bit line BL and controlled by the same word lines may vary according to a design.

Because one bit line BL is connected to a plurality of memory strings in parallel, the drain select transistors DST are independently controlled by select voltages respectively supplied to the first to fourth drain select lines DSL0 to DSL3 to selectively connect one bit line BL with the memory strings ST.

In the memory block 110MB, the first to eighth memory cells C0 to C7 vertically connected in the first vertical memory string VMS1 and the ninth to sixteenth memory cells C8 to C15 vertically connected in the second vertical memory string VMS2 are respectively controlled by operating voltages supplied to the stacked first to eighth word lines WL0 to WL7 and the stacked ninth to sixteenth word lines WL8 to WL15. The first to sixteenth word lines WL0 to WL15 are classified as a memory block unit.

The first to fourth select lines DSL0 to DSL3, the first to fourth source select lines SSL0 to SSL3, and the first to sixteenth word lines WL0 to WL15 serve as local lines of the memory block 110MB. Particularly, the first to fourth source select lines SSL0 to SSL3 and the word lines WL0 to WL7 may serve as local lines of the first vertical memory string VMS1, and the first to fourth drain select lines DSL0 to DSL3 and the word lines WL8 to WL15 may serve as local lines of the second vertical memory string VMS2. Meanwhile, gates of the pipe transistors PT in the memory block 110MB may be connected commonly using a pipe gate line PGL.

Meanwhile, in the memory block 110MB, memory cells connected to different bit lines and sharing a drain select line (e.g., DSL3) configure one PAGE. The memory block 110MB may be a basic unit of an erase loop, and the PAGE may be a basic unit of a program operation and a read loop.

Referring again to FIGS. 1 and 2B, the first to third operating circuits 120 to 140 are configured to perform a program loop, an erase loop, and a read operation of the memory cells (e.g., C0) connected to a selected word line (e.g., WL0). A program loop includes a program operation and a verification operation, and an erase loop includes an erase operation and a verification operation. The first to third operating circuits 120 to 140 may perform a program operation (or post program operation) to adjust an erase level by determining dispersion of threshold voltages of the memory cells after an erase loop.

In order to perform a program loop, an erase loop, and a read operation, the first to third operating circuits 120 to 140 are configured to selectively output operating voltages to the local lines of a selected memory block including the source select line SSL, the first to $n+1^{th}$ world lines WL0 to WLn, the pipe gate line connected to the pipe gate PG, and the drain select line DSL, selectively output operating voltages to the common source line SL of the selected memory block, and control a precharge/discharge of bit lines BL or sense a current flow (or a voltage change) of bit lines BL.

In the case of a NAND flash memory device, the first to third operation circuits 120 to 140 include a control circuit 120, a voltage supply circuit 130, and a read/write circuit 140, respectively. Each component will be specifically described below.

The control circuit 120 controls the voltage supply circuit 130. The voltage supply circuit 130 is configured to generate operating voltages to be applied to the local lines of the selected memory block at desired levels for performing one or more of a program loop, an erase loop, and a read operation in response to a command signal CMD input from the outside. To this end, the control circuit 120 may output a voltage control command CMDv and a row address signal RADD to the voltage supply circuit 130. Then, the control circuit 120 controls the read/write circuit 140 so as to control a precharge/discharge of bit lines BL according to data to be stored in the memory cells to perform a program loop, an erase loop, and a read operation or sense a current flow (or a voltage change) of bit lines BL for a read operation or a verification operation. To this end, the control circuit 120 may output an operation control command CMDpb to the read/write circuit 140.

The voltage supply circuit 130 generates operating voltages needed for a program loop, an erase loop, and a read operation of memory cells according to the voltage control command CMDv of the control circuit 120. Here, the operating voltages may include an erase voltage Verase, a program voltage Vpgm, a read voltage Vread, a pass voltage Vpass, first and second select voltages Vdsl and Vssl, a common source voltage Vsl, a pipe gate voltage Vpg, etc. Further, the voltage supply circuit 130 outputs the operating voltages to the local lines of the selected memory block, including the source select line SSL, the first to $n+1^{th}$ world lines WL0 to WLn, the pipe gate line PGL, and the drain select line DSL, and to the common source line SL of the selected memory block in response to the row address signal RADD received from the control circuit 120.

The read/write circuit 140 may include a plurality of page buffers (not shown) connected to the memory array 110 through the bit lines BL. Particularly, the page buffers may be connected to respective bit lines BL. That is, each page buffer may be connected to one bit line.

When a program operation is performed, the page buffers selectively precharge the bit lines BL according to the operation control command CMDpb received from the control circuit 120 and data to be stored in the memory cells.

When a program verification operation or a read operation is performed, according to the control command CMDpb received from the control circuit 120, the read/write circuit 140 may latch data read from selected memory cells by sensing a voltage change or current of bit lines BL after precharging the bit lines BL.

The gate control circuit 150 is configured to control a gate of a pipe transistor included in an unselected memory block when a program operation or a read operation is performed. In an embodiment, the gate control circuit 150 may also be configured to control a gate of a drain select transistor and a gate of a source select transistor included in the unselected memory block when the program operation or the read operation is performed. The gate control circuit 150 may control the gate of the pipe transistor differently according to whether the program operation or the read operation is performed. Likewise, the gate control circuit 150 may control the gate of the drain select transistor and the gate of the source select transistor included in the unselected memory block differently according to whether the program operation or the read operation is performed. In an embodiment, the gate control circuit 150 may control the gate of the pipe transistor included in the unselected memory block differently from the gate of the drain select transistor and the gate of the source select transistor when the program operation or the read operation is performed.

The gate control circuit 150 may be configured to operate in response to an inverted signal of a block select signal used to select a memory block. The gate control circuit 150 may be connected to a pipe gate line corresponding to the gate of the pipe transistor. In an embodiment, the gate control circuit 150 may also be connected to a drain select line and a source select line respectively corresponding to the gate of the drain select transistor and the gate of the source select transistor.

Figure 3:
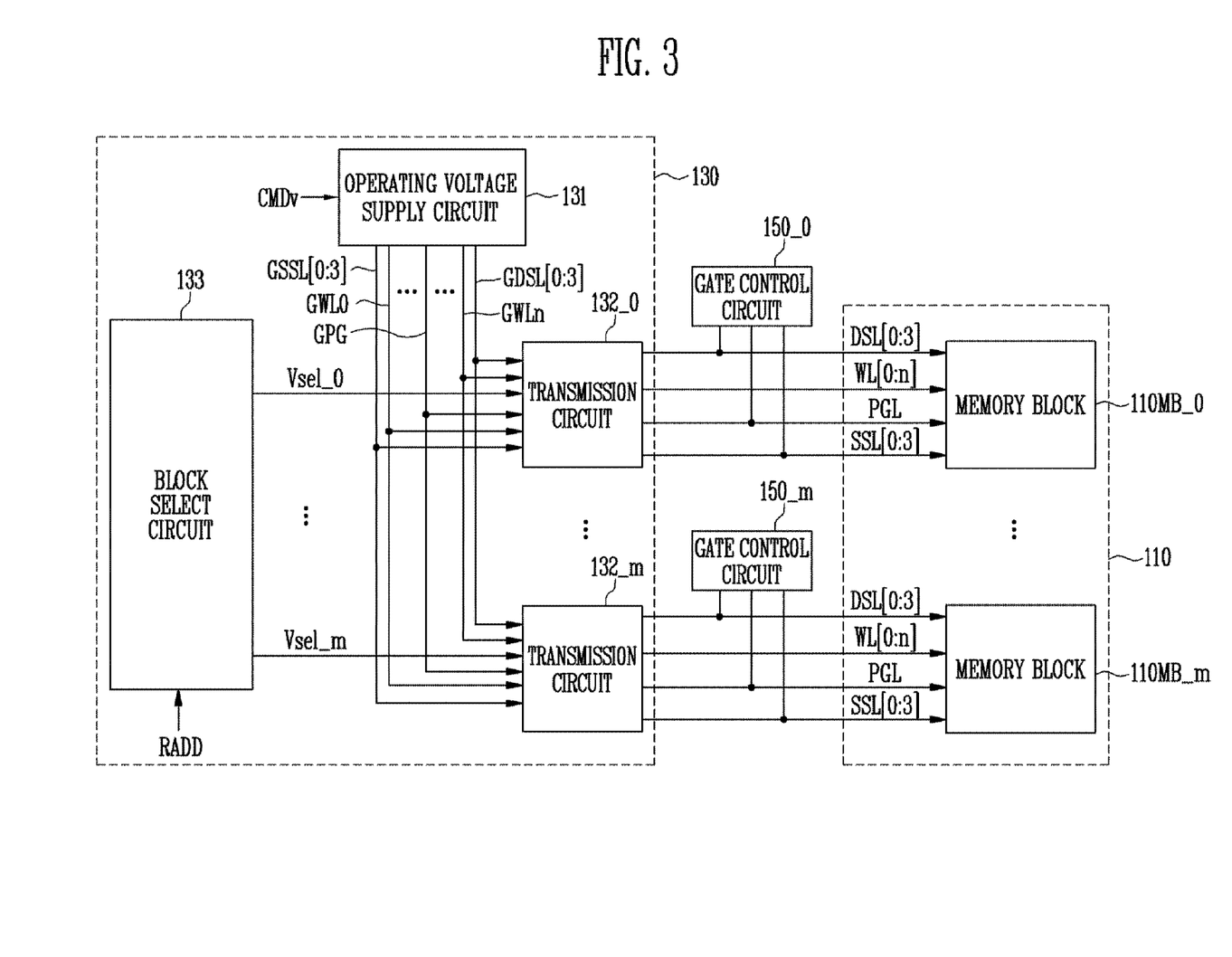
FIG. 3 is a block diagram illustrating a voltage supply circuit and a gate control circuit according to an illustrative embodiment.

FIG. 3 is a block diagram illustrating a voltage supply circuit 130 and first to $m+1^{th}$ gate control circuits 150_0 to 150_m according to an illustrative embodiment.

Referring to FIG. 3, the voltage supply circuit 130 of the semiconductor device includes a voltage generating circuit 131, first to $m+1^{th}$ connection circuits 132_0 to 132_m, and a block select circuit 133. The first to $m+1^{th}$ memory blocks 110MB_0 to 110MB_m of the memory array 110 may each include a memory block such as the memory block 110MB illustrated in FIGS. 2A to 2C.

The voltage generating circuit 131 is configured to output operating voltages to global lines in response to a voltage control command CMDv received from a control circuit, e.g., 120 shown in FIG. 1. The global lines include first to fourth global source select lines GSSL[0:3], first to $n^{th}$ global word lines GWL0 to GWLn, a global pipe gate line GPG, and first to fourth global drain select lines GDSL[0:3]. For example, the voltage generating circuit 131 outputs operating voltages needed for a program loop, a read operation, and an erase loop of the memory cells to the global lines.

The first to $m+1^{th}$ connection circuits 132_0 to 132_m are connected between the global lines and local lines of the respective first to $m+1^{th}$ memory blocks 110MB_0 to 110MB_M. The local lines include first to fourth source select lines SSL[0:3], first to $n^{th}$ word lines WL[0:n], a pipe gate line PGL, and first to fourth drain select lines DSL[0:3]. The first to $m+1^{th}$ connection circuits 132_0 to 132_m are operated in response to first to $m+1^{th}$ block select signals Vsel_0 to Vsel_m of the block select circuit 133. That is, in order for the operating voltages (e.g., program voltage, erase voltage, read voltage, pass voltage, pipe gate voltage, verification voltage, etc.) output to the global lines from the voltage generating circuit 131 to be transmitted to the corresponding local lines of a selected memory block 110MB, the first to m+1$^{th}$ connection circuits 132_0 to 132_m perform an operation of selectively connect the global lines to the local lines of the selected memory block 110MB in response to the first to m+1$^{th}$ block select signals Vsel_0 to Vsel_m of the block select circuit 133.

Each of the first to m+1$^{th}$ connection circuits 132_0 to 132_m may include transistors TR (see FIG. 4) respectively connected between the global lines and the respective local lines of a corresponding memory block of the first to m+1$^{th}$ memory block 110MB_0 to 110MB_m. The transistors TR may connect the first to fourth global source select lines GSSL[0:3], first to n$^{th}$ global word lines GWL0 to GWLn, global pipe gate line GPG, and first to fourth global drain select lines GDSL[0:3] of the global lines to the first to fourth source select lines SSL[0:3], first to n$^{th}$ word lines WL[0:n], pipe gate line PGL, and first to fourth drain select lines DSL[0:3] of the local lines, respectively.

In the case of a flash memory device, the first to m+1$^{th}$ connection circuits 132_0 to 132_m may be provided for each of the first to m+1$^{th}$ memory blocks 110MB_0 to 110MB_m, and the first to m+1$^{th}$ connection circuits 132_0 to 132_m may be selectively operated in response to the first to m+1$^{th}$ selection signals Vsel_0 to Vsel_m of the block select circuit 133. For example, one connection circuit from among the first to m+1$^{th}$ connection circuits 132_0 to 132_m may be selectively operated according to the first to m+1$^{th}$ block select signals Vsel_0 to Vsel_m of the block select circuit 133.

The block select circuit 133 may respectively output the first to m+1$^{th}$ block select signals Vsel_0 to Vsel_m to the first to m+1$^{th}$ connection circuits 132_0 to 132_m in response to a row address signal RADD. According to the row address signal RADD, one signal among the first to m+1$^{th}$ block select signals Vsel_0 to Vsel_m may be activated and the other signals may be deactivated. For example, when the row address signal RADD has a first value, the first connection circuit 132_0 receives the activated first block select signal Vsel_0, and as a result transmits the operating voltages which are supplied to the global lines to the local lines of the selected first memory block 110MB_0 without a voltage drop. Meanwhile, the second to m+1$^{th}$ connection circuits 132_1 to 132_m receive the inactivated second to m+1$^{th}$ block select signals Vsel_1 to Vsel_m, and as a result block the operating voltages which are supplied to the global lines from being transmitted to the local lines of the second to m+1$^{th}$ memory blocks 110_1 to 110MB_m.

The first to m+1$^{th}$ gate control circuits 150_0 to 150_m are provided to the first to m+1$^{th}$ memory blocks 110MB_0 to 110MB_m, respectively. That is, the first to m+1$^{th}$ gate control circuits 150_0 to 150_m may be respectively connected to pipe transistors, drain select transistors and source select transistors of the first to m+1$^{th}$ memory blocks 110MB_0 to 110MB_m through the respective pipe gate line PGL, first to fourth drain select lines DSL[0:3], and first to fourth source select lines SSL[0:3].

Figure 4:
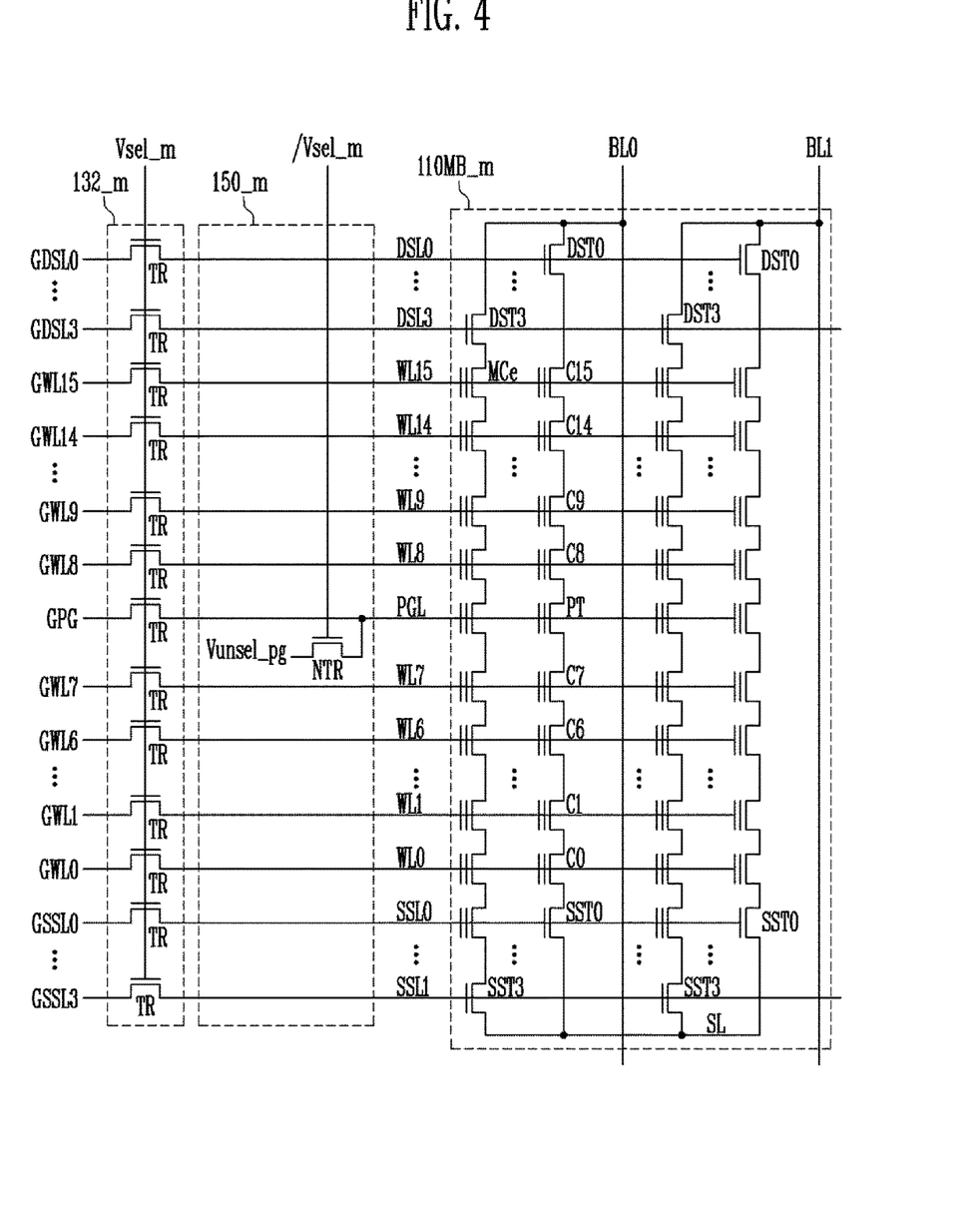
FIGS. 4, 5A, and 5B are circuit diagrams illustrating a semiconductor device according to illustrative embodiments.
Figure 5A:
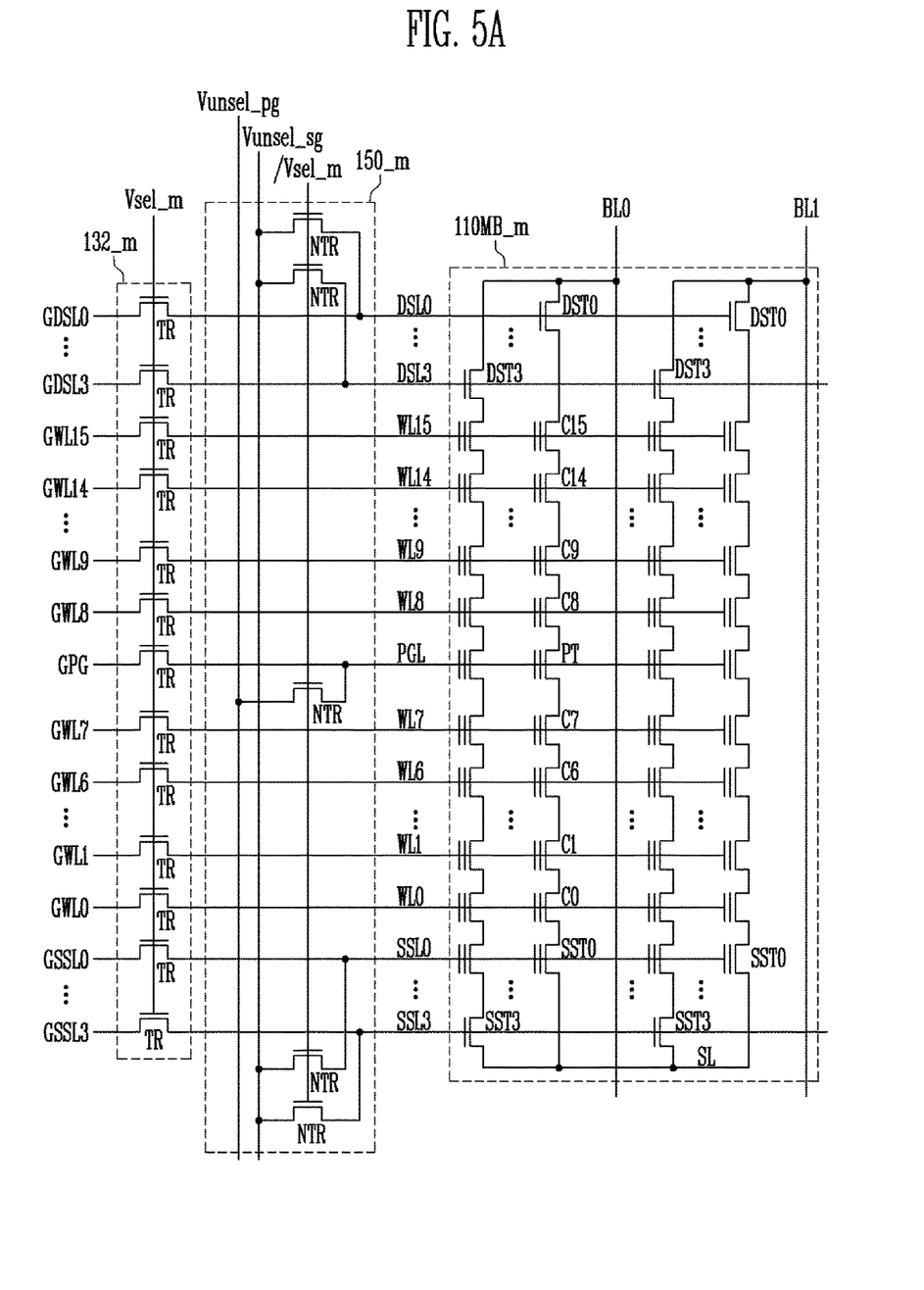
Figure 5B:
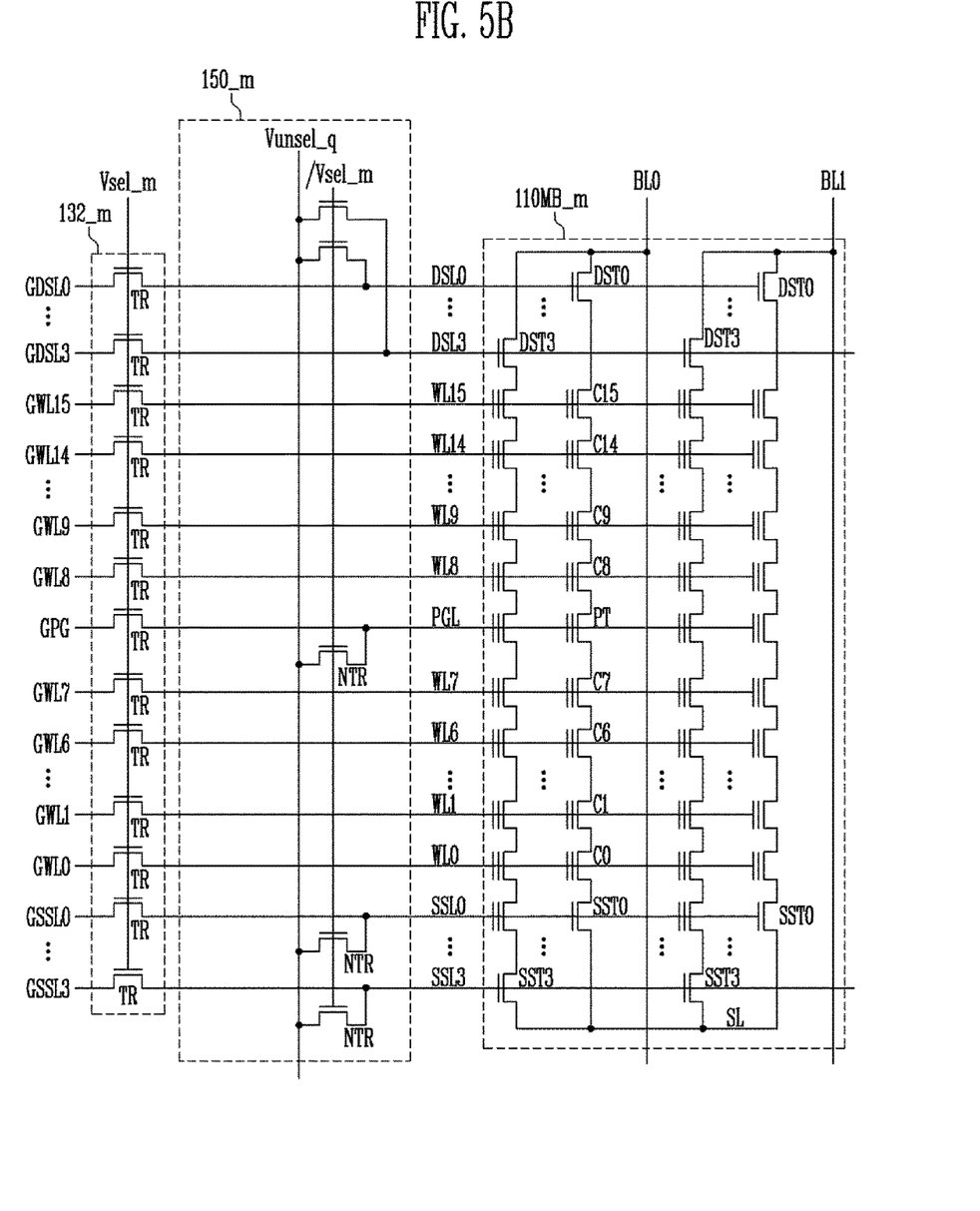

FIGS. 4, 5A, and 5B are circuit diagrams illustrating a semiconductor device according to illustrative embodiments.

Referring to FIG. 4, the m$^{th}$ connection circuit 132_m corresponding to the unselected m$^{th}$ memory block 110MB_m receives the m$^{th}$ block select signal Vsel_m in a disabled state, and as a result the global lines, including the first to fourth global source select lines GSSL0 to GSSL3, the first to sixteenth global word lines GWL0 to GWL15, the global pipe gate line GPG, and the first to fourth global drain select lines GSSL0 to GSSL3, are not connected to the local lines, including the first to fourth source select lines SSL0 to SSL3, the first to sixteenth word lines WL0 to WL15, the pipe gate line PGL, and the first to fourth drain select lines DSL0 to DSL3, of the unselected m$^{th}$ memory block 110MB_m.

The m$^{th}$ gate control circuit 150_m may be connected to the pipe gate line PGL among the local lines of the unselected m$^{th}$ memory block 110MB_m, and may control the pipe gate line PGL corresponding to a gate of a pipe transistor PT in response to an m$^{th}$ inverted block select signal /Vsel_m corresponding to the m$^{th}$ block select signal Vsel_m. The m$^{th}$ gate control circuit 150_m may include a transistor NTR connected to the pipe gate line PGL and operating in response to the m$^{th}$ inverted block select signal /Vsel_m, and may selectively apply an unselected pipe voltage Vunsel_pg to the pipe gate line PGL using the transistor NTR. That is, the m$^{th}$ gate control circuit 150_m is configured to control, through the pipe gate line PGL, the gate of the pipe transistor PT included in the unselected m$^{th}$ memory block 110MB_m.

When a program operation is performed, the gate control circuit 150_m may turn off the pipe transistor PT included in the unselected memory block 110MB_m by controlling the gate of the pipe transistor PT. To this end, the gate control circuit 150_m may be configured to apply the unselected pipe voltage Vunsel_pg having a ground level to the gate of the pipe transistor PT included in the unselected memory block 110MB_m.

In an embodiment, when a read operation is performed, the gate control circuit 150_m may turn off the pipe transistor PT included in the unselected memory block 110MB_m by controlling the gate of the pipe transistor PT. To this end, the gate control circuit 150_m may be configured to apply the unselected pipe voltage Vunsel_pg having the ground level to the gate of the pipe transistor PT included in the unselected memory block 110MB_m.

In an embodiment, when the read operation is performed, the gate control circuit 150_m may turn on the pipe transistor PT included in the unselected memory block 110MB_m by controlling the gate of the transistor PT. To this end, the gate control circuit 150_m may be configured to apply the unselected pipe voltage Vunsel_pg having a positive potential (e.g., a power voltage) to the gate PG of the pipe transistor PT included in the unselected memory block 110MB_m. In another embodiment, when the read operation is performed, the gate control circuit 150_m may set the gate of the pipe transistor PT included in the memory block 110MB_m to a floating state.

Even when the first to fourth source select lines SSL0 to SSL3, the first to sixteenth word lines WL0 to WL15, and the first to fourth drain select lines DSL0 to DSL3 of the unselected memory block 110MB_m enter a floating state, various unselected pipe voltages Vunsel_pg may be applied to the pipe gate line PGL according to an operation of the gate control circuit 150_m. Therefore, the pipe transistor PT of the unselected memory block 110MB_m may reliably turn off or turn on according to the operation. As a result, when the program operation or the read operation is performed, a leakage current flow from the bit lines BL0 and BL1 to the common source line SL through the unselected memory block 110MB_m may be blocked.

Referring to the embodiment shown in FIG. 5A, the m$^{th}$ gate control circuit 150_m may control first to fourth drain select lines DSL0 to DSL3 respectively corresponding to gates of first to fourth drain select transistors DST0 to DST3 and first to fourth source select lines SSL0 to SSL3 respectively corresponding to gates of first to fourth source select transistors SST0 to SST3, in addition to controlling a pipe transistor PT of the unselected memory block 110MB_m.

In an embodiment, when a program operation is performed, the $m^{th}$ gate control circuit 150_$m$ may control the gates of the first to fourth drain select transistors DST0 to DST3 and the gates of the first to fourth source select transistors SST0 to SST3 so that the first to fourth drain select transistors DST0 to DST3 and the first to fourth source select transistors SST0 to SST3 included in the memory block 110MB_m are turned off. To this end, when the program operation is performed, the $m^{th}$ gate control circuit 150_$m$ may apply the unselected gate voltage Vunsel_sg having a ground level to the first to fourth drain select lines DSL0 to DSL3 connected to the gates of the first to fourth drain select transistors DST0 to DST3 and to the first to fourth source select lines SSL0 to SSL3 connected to the gates of the first to fourth source select transistors SST0 to SST3 included in the unselected memory block 110MB_m.

In another embodiment, when the program operation is performed, the gate control circuit 150_$m$ may set the gates of the first to fourth drain select transistors DST0 to DST3 and the gates of the first to fourth source select transistors SST0 to SST3 included in the unselected memory block 110MB_m to a floating state. When the program operation is performed, the $m^{th}$ gate control circuit 150_$m$ may control a gate of the pipe transistor PT as described with respect to FIG. 4, above.

When a read operation is performed, the $m^{th}$ gate control circuit 150_$m$ may control the gates of the first to fourth drain select transistors DST0 to DST3 and the gates of the first to fourth source select transistors SST0 to SST3 so that the first to fourth drain select transistors DST0 to DST3 and first to fourth source select transistors SST0 to SST3 included in the memory block 110MB_m are turned off. To this end, when the read operation is performed, the gate control circuit 150_$m$ may apply the unselected gate voltage Vunsel_sg of a ground level to the first to fourth drain select lines DSL0 to DSL3 connected to the gates of the first to fourth drain select transistors DST0 to DST3 and to the first to fourth source select lines SSL0 to SSL3 connected to the gates of the first to fourth source select transistors SST0 to SST3 included in the unselected memory block 110MB_m. When the read operation is performed, the $m^{th}$ gate control circuit 150_$m$ may control a gate of the pipe transistor PT as described with respect to FIG. 4, above.

When the memory block 110MB_m is selected in the program or read operation, a value of the $m^{th}$ inverted block select /Vsel_m causes the $m^{th}$ gate control circuit 150_$m$ to not operate, and the operating voltages which are transmitted through the $m^{th}$ connection circuit 132_$m$ are applied to the first to fourth source select lines SSL0 to SSL3, first to fourth drain select lines DSL0 to DSL3, and the pipe gate line PGL from the first to fourth global source select lines GSSL0 to GSSL3, first to fourth global drain select lines GDSL0 to GDSL3, and the global pipe gate line GPG, respectively. Therefore, the first to fourth source select transistors SST0 to SST3, first to fourth drain select transistors DST0 to DST3, and the pipe transistor PT are operated according to the operating voltages applied to the first to fourth source select lines SSL0 to SSL3, first to fourth drain select lines DSL0 to DSL3 and the pipe gate line PGL, respectively.

According to the above condition, when the $m^{th}$ gate control circuit 150_$m$ controls the first to fourth source select lines SSL0 to SSL3, first to fourth drain select lines DSL0 to DSL3, and the pipe gate line PGL of the unselected $m^{th}$ memory block 110MB_m, a leakage current flow from the bit lines BL0 and BL1 to the common source line SL through the unselected $m^{th}$ memory block 110MB_m may be blocked more effectively. Therefore, operational characteristics and reliability of the semiconductor device may be improved.

Referring to the embodiment shown in FIG. 5B, because the $m^{th}$ connection circuit 132_$m$ of the unselected memory block 110MB_m is not operated in response to a block select signal Vsel_m having a disabled state, global lines, including first to fourth global source select lines GSSL0 to GSSL3, first to sixteenth global word lines GWL0 to GWL15, global pipe gate line GPG, and first to fourth global drain select lines GDSL0 to GDSL3, are not connected to the respective local lines of the unselected $m^{th}$ memory block 110MB_m, including first to fourth source select lines SSL0 to SSL3, first to sixteenth word lines WL0 to WL15, pipe gate line PGL, and first to fourth drain select lines DSL0 to DSL3.

The $m^{th}$ gate control circuit 150_$m$ may be connected to the first to fourth drain select lines DSL0 to DSL3, the first to fourth source select lines SSL0 to SSL3, and the pipe gate line PGL among the local lines of the memory block 110MB_m, and may control the connected local lines in response to the $m^{th}$ inverted block select signal /Vsel_m of the block select signals.

The $m^{th}$ gate control circuit 150_$m$ may include transistors NTR connected to the first to fourth drain select lines DSL0 to DSL3, the first to fourth source select lines SSL0 to SSL3, and the pipe gate line PGL, respectively, and operating in response to the $m^{th}$ inverted block select signal /Vsel_m. An unselected gate voltage Vunsel_q is supplied to drains of the transistors NTR. That is, the drains of the transistors NTR included in the $m^{th}$ gate control circuit 150_$m$ may be connected to each other. The unselected gate voltage Vunsel_q may be selectively applied to the first to fourth drain select lines DSL0 to DSL3, the first to fourth source select lines SSL0 to SSL3, and the pipe gate line PGL using the transistors NTR. That is, the $m^{th}$ gate control circuit 150_$m$ is configured to control the gates of the first to fourth drain select transistors DST0 to DST3, first to fourth source select transistors SST0 to SST3, and pipe transistor PT included in the unselected memory block 110MB_m.

When the program or read operation is performed, the $m^{th}$ gate control circuit 150_$m$ may control the gates of the first to fourth drain select transistors DST0 to DST3, first to fourth source select transistors SST0 to SST3, and pipe transistor PT so that the first to fourth drain select transistors DST0 to DST3, first to fourth source select transistors SST0 to SST3, and pipe transistor PT included in the unselected memory block 110MB_m are turned off. To this end, the gate control circuit 150_$m$ may be configured to apply the unselected gate voltage Vunsel_q having a ground level to the gate of the pipe transistor PT included in the unselected memory block 110MB_m. That is, the ground voltage may become the unselected gate voltage Vunsel_q.

Even when the local lines of the unselected $m^{th}$ memory block 110MB_m would otherwise enter a floating state, the unselected gate voltage Vunsel_q having a ground level may be applied to the first to fourth drain select lines DSL0 to DSL3, the first to fourth source select lines SSL0 to SSL3, and the pipe gate line PGL according to an operation of the gate control circuit 150_$m$. Thus, the first to fourth drain select transistors DST0 to DST3, first to fourth source select transistors SST0 to SST3, and pipe transistor PT of the unselected memory block 110MB_m may be reliably turned off when program and read operations are performed. As a result, when the program or read operation is performed, the leakage current flow from the bit lines BL0 and BL1 to the common source line SL through the unselected $m^{th}$ memory block 110MB_m may be blocked.

When the memory block 110MB_m is selected in the program or read operation, a value of the $m^{th}$ inverted block select /Vsel_m causes the $m^{th}$ gate control circuit 150_m to not operate, and operating voltages which are transmitted through the $m^{th}$ connection circuit 132_m from the first to fourth global source select lines GSSL0 to GSSL3, first to fourth global drain select lines GDSL0 to GDSL3, and the global pipe gate line GPG are applied to the first to fourth source select lines SSL0 to SSL3, first to fourth drain select lines DSL0 to DSL3, and the pipe gate line PGL. Therefore, the first to fourth source select transistors SST0 to SST3, first to fourth drain select transistors DST0 to DST3, and the pipe transistor PT are operated according to the operating voltage applied to the first to fourth source select lines SSL0 to SSL3, the first to fourth drain select lines DSL0 to DSL3 and the pipe gate line PG, respectively.

According to the above condition, when the $m^{th}$ gate control circuit 150_m controls the first to fourth source select lines SSL0 to SSL3, first to fourth drain select lines DSL0 to DSL3, and the pipe gate line PGL of the unselected $m^{th}$ memory block 110MB_m, a leakage current flow from bit lines BL0 and BL1 to the common source line SL through the unselected $m^{th}$ memory block 110MB_m may be blocked more effectively. Therefore, operational characteristics and reliability of the semiconductor device may be improved.

Figure 6:
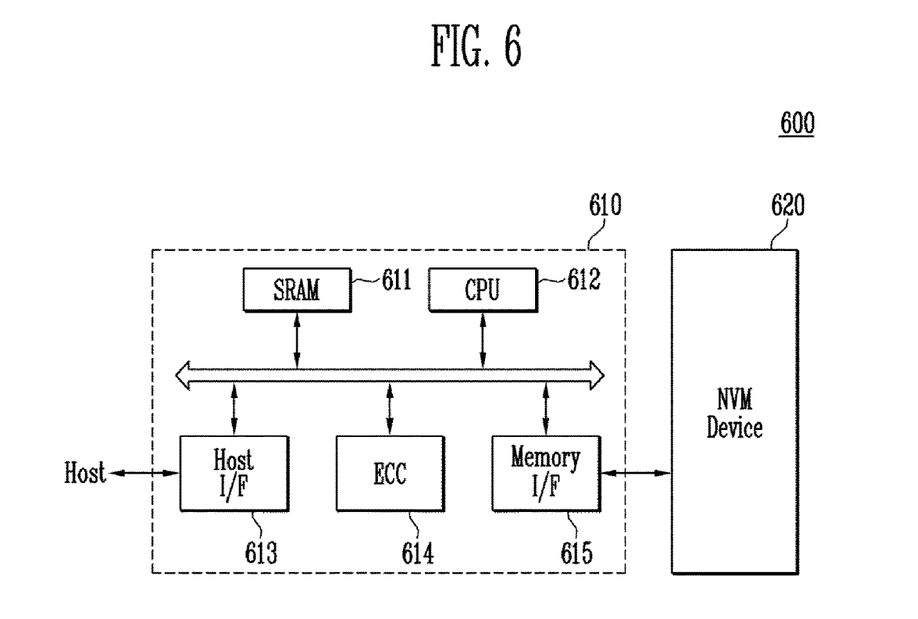
FIG. 6 is block diagram briefly showing a memory system according to an illustrative embodiment.

FIG. 6 is a block diagram briefly showing a memory system according to an illustrative embodiment.

Referring to FIG. 6, a memory system 600 according to the illustrative embodiment includes a non-volatile memory device 620 and a memory controller 610.

The non-volatile memory device 620 may correspond to the semiconductor device illustrated in FIG. 1, and be connected to the memory block and the operation circuit as illustrated in FIG. 3. The memory controller 610 is configured to control the non-volatile memory device 620. The non-volatile memory device 620 may be provided as a memory card or a semiconductor disk device (i.e., solid state disk (SSD)) in combination with the memory controller 610. An SRAM 611 is used as an operation memory of a processing unit (CPU) 612. A host interface 613 includes a data exchange protocol of a host Host interfacing with the memory system 600. An error correction block (ECC) 614 checks for and corrects errors included in data read from a cell area of the non-volatile memory device 620. A memory interface 615 interfaces with the non-volatile memory device 620. The CPU 612 performs overall operations to exchange data of the memory controller 610.

Although not shown in the drawing, it is apparent to those of ordinary skill in the art that the memory system 600 according to the illustrative embodiment may also be provided with a ROM (not shown) to store code data for interfacing with a host Host. The non-volatile memory device 620 may be provided as a multi-chip package configured with a plurality of flash memory chips. The memory system 600 according to the illustrative embodiment may be provided as a highly reliable storage medium with improved operational characteristics. Specifically, the flash memory device may be included in a memory system such as a semiconductor disk device (i.e., SSD) which has been actively studied recently. In this case, the memory controller 610 may be configured to communicate with the outside (e.g., a host Host) through one of various interface protocols such as Universal Serial Bus (USB), Multi-Media Card (MMC), PCI Express (PCI-E), Serial AT Attachment (SATA), Parallel AT Attachment (PATA), Small Computer System Interface (SCSI), Enhanced Small Disc Interface (ESDI), Integrated Drive Electronics (IDE), etc.

Figure 7:
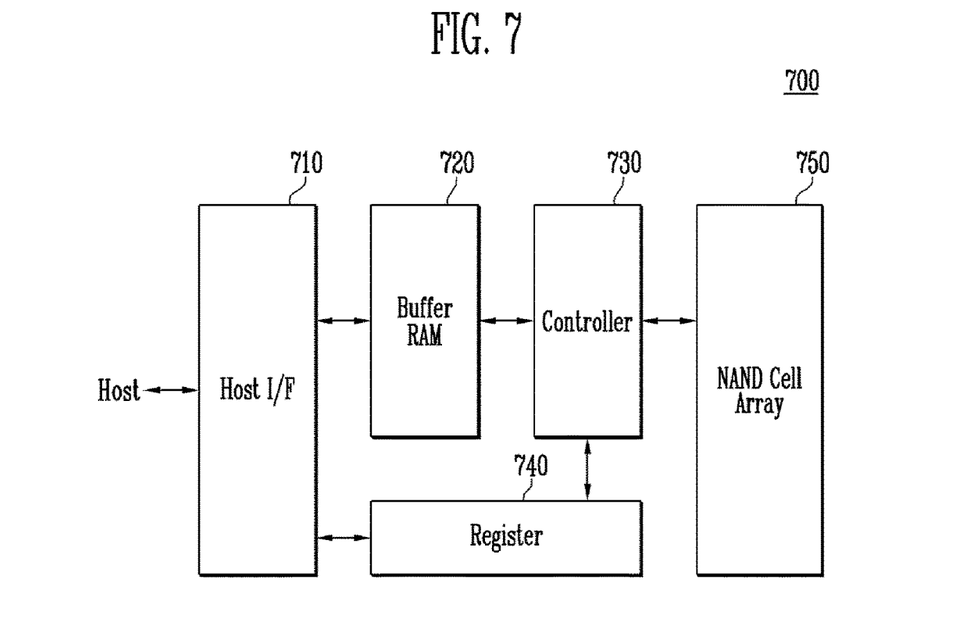
FIG. 7 is a block diagram briefly showing a fusion memory device or a fusion memory system according to the various illustrative embodiments illustrated above.

FIG. 7 is a block diagram briefly showing a fusion memory device or a fusion memory system performing a program operation. For example, the aspect of the present disclosure may be applied to a OneNAND flash memory device 700 as a fusion memory device.

The OneNAND flash memory device 700 includes a host interface 710 configured to exchange various types of data with a device using different protocols, a buffer RAM 720 in which a code for driving a memory device is embedded or data is temporarily stored, a controller 730 that controls read and program operations and all states in response to a control signal and a command from the outside, a register 740 that stores data such as a command and an address, a configuration defining a system operation environment in a memory device, and a NAND flash cell array 750 configured with an operation circuit including a non-volatile memory cell and a page buffer. The OneNAND flash memory device 700 writes data in response to a write operation request from a host Host in a general method.

Figure 8:
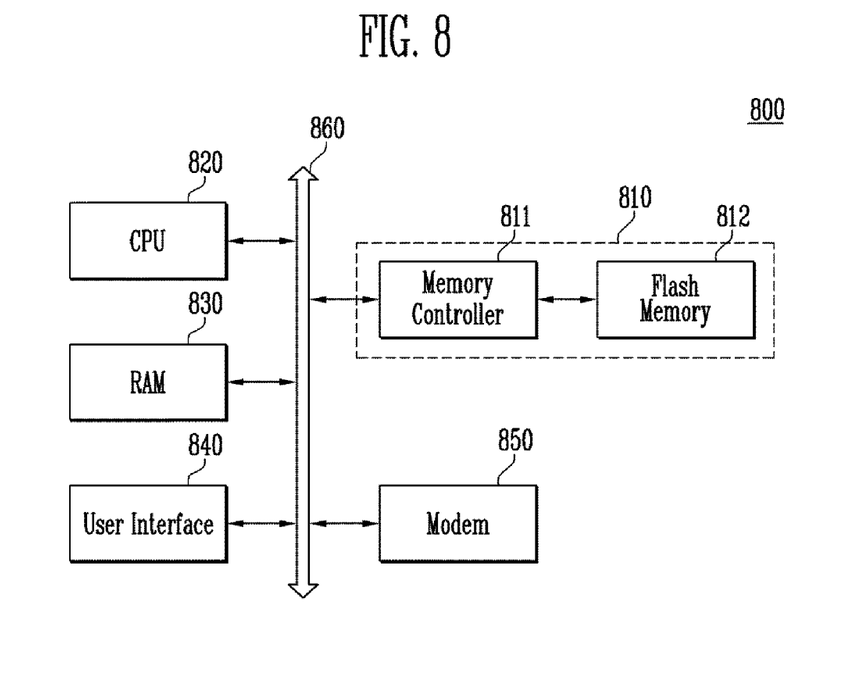
FIG. 8 is a block diagram briefly showing a computing system including a flash memory device according to an illustrative embodiment.

FIG. 8 schematically shows a computing system including a flash memory device 812 according to an illustrative embodiment of the present disclosure.

A computing system 800 according to the illustrative embodiment includes a microprocessor (CPU) 820, a RAM 830, a user interface 840, a modem 850 such as a baseband chipset, and a memory system 810 connected electrically to a system bus 860. When the computing system 800 according to the illustrative embodiment is a mobile device, a battery (not shown) may also be provided to supply an operating voltage of the computing system 800. Although not shown in the drawing, it is apparent to those of ordinary skill in the art that the computing system 800 according to the illustrative embodiment may also include an application chipset, a camera image processor (CIS), a mobile DRAM, etc. For example, the memory system 810 may configure an SSD using the non-volatile memory illustrated in FIG. 1 to store data. The memory system 810 may be provided as a fusion flash memory (e.g., OneNAND flash memory) as well.

Embodiments of the present disclosure include semiconductor devices having improved operational characteristics and reliability.

In the drawings and specification, there have been disclosed illustrative embodiments of the present disclosure, and although specific terms are employed, they are used in a generic and descriptive sense only and not for purposes of limitation. As for the scope of the disclosure, it is to be set forth in the following claims. Therefore, it will be understood by those of ordinary skill in the art that various changes in form and details may be made therein without departing from the spirit and scope as defined by the following claims.

What is claimed is:

1. A semiconductor device comprising:
a memory array including a plurality of memory blocks, wherein each memory block includes a plurality of memory strings coupled between bit lines and a common source line, a drain select line, and a source select line, each memory string including a pipe transistor, a drain select transistor coupled to a corresponding bit line among the bit lines, first memory cells connected between the pipe transistor and the drain select transistor, a source select transistor coupled to the common source line, and second memory cells connected between the pipe transistor and the source select transistor, wherein gates of the drain select transistors, gates of the source select transistors, and gates of the pipe transistors included in a memory block are connected to the drain select line of the memory block, to the source select line of the memory block, and to a pipe gate line, respectively, and the plurality of memory strings included in each memory block are connected to word lines;

an operation circuit configured to apply a plurality of operating voltages to a memory block selected to perform a program operation and a read operation; and a gate control circuit configured to control the pipe gate line connected to an unselected memory block, the drain select line of the unselected memory block, and the source select line of the unselected memory block, wherein the gate control circuit includes transistors coupled to the pipe gate line, the drain select line and the source select line to control voltages of the pipe gate line, the drain select line and the source select line coupled to the unselected memory block, wherein the gate control circuit applies a pipe gate voltage which is different from a read voltage to the pipe gate line coupled to the selected memory block, and applies a ground voltage to the pipe gate line coupled to the unselected memory block when the program operation is performed, and wherein the gate control circuit applies the pipe gate voltage to the pipe gate line coupled to the selected memory block, and applies the ground voltage to the pipe gate line coupled to the unselected memory block when the read operation is performed.

2. The semiconductor device of claim 1, wherein the gate control circuit is configured to turn off the pipe transistor included in the unselected memory block when the program operation is performed on the selected memory block.

3. The semiconductor device of claim 2, wherein the gate control circuit is configured to turn off the pipe transistor included in the unselected memory block by applying the ground voltage to the pipe gate line connected to the unselected memory block.

4. The semiconductor device of claim 1, wherein the gate control circuit is configured to turn off the pipe transistor included in the unselected memory block when the read operation is performed on the selected memory block.

5. The semiconductor device of claim 4, wherein the gate control circuit is configured to turn off the pipe transistor included in the unselected memory block by applying the ground voltage to the pipe gate line connected to the unselected memory block.

6. The semiconductor device of claim 1, wherein the word lines connected to the unselected memory block float during the program operation or the read operation being performed on the selected memory block.

7. The semiconductor device of claim 1, wherein the gate control circuit is configured to apply a non-zero positive voltage to the drain select line and the source select line that are connected to the unselected memory block when the program operation is performed on the selected memory block.

8. The semiconductor device of claim 7, wherein the non-zero positive voltage is a power voltage.

* * * * *